(12) United States Patent
Shimada (10) Patent No.: US 6,375,484 B1
(45) Date of Patent: Apr. 23, 2002

(54) ELECTRICAL PART SOCKET WITH PIVOTABLE LATCH

(75) Inventor: Hideo Shimada, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/580,564

(22) Filed: May 30, 2000

(30) Foreign Application Priority Data

May 31, 1999 (JP) .......................................... 11-151838

(51) Int. Cl.[7] .............................................. H01R 13/62
(52) U.S. Cl. ........................ 439/330; 439/268; 439/152
(58) Field of Search ................................ 439/330, 268, 439/266, 157, 160, 153, 152

(56) References Cited

U.S. PATENT DOCUMENTS 4,178,051 A * 12/1979 Kocher et al. ............... 439/157
5,348,489 A * 9/1994 Yeh .............................. 439/153
6,149,449 A * 11/2000 Abe ............................. 439/268

* cited by examiner

Primary Examiner—Brian Sircus
Assistant Examiner—Javaid Nasri
(74) Attorney, Agent, or Firm—Staas & Halsey LLP (57) ABSTRACT

A socket for an electrical part, having a socket body with a mount portion on which an electrical part is mounted, an operation member with an operative portion vertically movable with respect to the socket body, a conductive portion electrically connected to the electrical part through a contact to a terminal of the electrical part and a latch that presses a peripheral edge portion of the electrical part mounted on the mount portion and is urged by an urging force in one direction. The latch has a pressing portion pressing the peripheral edge portion of the electrical part against the mount portion when the latch is pivoted in a first direction, a displacement portion abutting against the electrical part to move the electrical part when the latch is pivoted in a second direction against the urging force and a press portion to be pressed by the operative portion of the operation member when the operation member is moved downward so the latch is pivoted in the second direction.

16 Claims, 9 Drawing Sheets

ELECTRICAL PART SOCKET WITH PIVOTABLE LATCH

BACKGROUND OF THE INVENTION

The present invention relates to a socket for electrical parts for detachably holding an electrical part such as semiconductor device (called herein as "IC package"), particularly having a structure capable of easily taking out the electrical part from the socket.

In prior art of this technical field, there is provided Japanese Patent Laid-open Publication No. SHO 63-2275, which shows an IC take-out mechanism in an IC socket. In this prior art structure, a seesaw lever is disposed in an IC accommodation portion to be capable of carrying out a seesaw motion. In this structure, the IC is supported by one lever portion (push-up lever portion) of the seesaw lever performing the seesaw motion and a push-down force is applied by another one lever portion thereof (push-down lever portion). According to this structure, when the downward push force is applied, the push-up lever portion is pushed up to thereby easily take out the IC.

However, in this prior art structure, in order to easily take out the IC, it is inevitable to locate the seesaw lever in the IC accommodation portion, which requires an additional member or parts. This provides a problem against a recent requirement of making compact the IC socket in size and in location space, thus being inconvenient.

SUMMARY OF THE INVENTION

It is an object of the present invention is to substantially eliminate defects or drawbacks encountered in the prior art mentioned above and to provide a socket for electrical parts capable of easily taking out the electrical parts without increasing members or parts constituting the socket.

This and other objects can be achieved according to the present invention by providing, in one aspect, a socket for an electrical part, which has a socket body having a mount portion on which an electrical part is mounted, the socket body being provided with a conductive portion electrically connected to the electrical part through a contact to a terminal of the electrical part and a latch means for pressing a peripheral edge portion of the electrical part mounted on the mount portion, and the latch means is provided for the socket body to be pivotal, the latch means being formed with a press portion pressing the peripheral edge portion of the electrical part against the mount portion when the latch mans is pivoted in one direction and formed with a displacement portion abutting against the electrical part to move the electrical part when the latch means is pivoted in another one direction.

According to this aspect, the electrical part can be easily taken out by forming the displacement portion to the latch member without increasing the number of parts, and particularly, even in the case where the electrically conductive member is stuck (adhere) to the terminal of the electrical part, the sticking condition can be released by moving the latch means (displacement portion), thus the electrical part being easily taken out.

In another aspect, there is also provided a socket for an electrical part, which has a socket body having a mount portion on which an electrical part is mounted, and in which a contact pin having an elastic piece is disposed to the socket body so as to be contacted to or separated from a solder ball as a terminal of the electrical part, a movable plate is disposed to the socket body to be movable thereto, the elastic piece of the contact pin is elastically deformed when the movable plate is moved to thereby displace a contact portion formed to an end portion of the elastic piece to separate the contact portion from the solder ball, and a latch means is provided for the socket body to be pivotal for pressing a peripheral edge portion of the electrical part mounted on the mount portion of the socket body, and the latch means is formed with a press portion pressing the peripheral edge portion of the electrical part against the mount portion when the latch means is pivoted in one direction and formed with a displacement portion abutting against the electrical part to move the electrical part when the latch means is pivoted in another one direction.

According to this aspect, in the case where the contact portion of the contact pin is stuck to the solder ball, this sticking state can be released by moving the latch means, and the electrical part can be hence easily taken out.

In a preferred embodiments of the above aspect, the latch means comprises at least a pair of latch members to portions on a side opposite to the electrical part, the latch members being formed with the displacement portions, respectively, so that the displacement portions move up the electrical part from the mount portion formed to the socket body. The displacement portion of the latch member presses an end surface portion of the peripheral edge portion of the electrical part so as to slide the electrical part on the mount portion.

According to such embodiment, the electrical part can be taken out by moving upward the electrical part by the displacement portion of the latch means.

In a more concrete aspect of the present invention, there is provided a socket for an electrical part comprising:

a socket body having a mount portion on which an electrical part is mounted, the electrical part having terminals;

a number of contact pins arranged to the socket body and adapted to be contacted to or separated from the terminals of the electrical part, respectively;

a movable plate disposed to the socket body so as to be movable with respect to the socket body, each of the contact pins having an elastic piece formed at a front end portion thereof with a contact portion, the contact portion being displaced in accordance with the movement of the movable plate so as to contact to the terminal of the electrical part to thereby be electrically connected thereto; and a latch means disposed to the socket body to be pivotal and adapted to move the electrical part, the latch means being formed with a press portion pressing a peripheral edge portion of the electrical part against the mount portion when the latch means is pivoted in one direction and formed with a displacement portion abutting against the electrical part to move the electrical part when the latch means is pivoted in another one direction.

The displacement portion may be formed so as to have a sharp or round end portion abutting against the electrical part.

The nature and further characteristic features of the present invention will be made more clear from the following descriptions made with reference to the accompanying drawings.

BRIEF DESCRIPTION OF THE DRAWINGS

In the accompanying drawings:

FIG. 4 shows an IC package according to the first embodiment of the present invention and includes FIG. 4A showing a front view thereof and FIG. 4B showing a bottom view thereof;

FIG. 5 shows a contact pin according to the first embodiment of the present invention and includes FIG. 5A being a front view thereof, FIG. 5B being a right side view thereof and FIG. 5C being a sectional view taken along the line VC—VC in FIG. 5A;

FIG. 6 includes FIG. 6A showing a state that a pair of contact portions of the contact pin are closed, FIG. 6B showing a state that a pair of contact portions thereof are opened and FIG. 6C showing a state that a solder ball is clamped between the paired contact portions;

DESCRIPTION OF THE PREFERRED EMBODIMENTS

The preferred embodiments of the present invention will be described hereunder with reference to the accompanying drawings.

[First Embodiment]

FIG. 1 to FIG. 10 represent the first embodiment of the present invention.

Referring first to a structure of the first embodiment, reference numeral 11 represents an IC socket as "socket for electrical parts". For carrying out a performance test of an IC package as "electrical part", the IC socket 11 electrically connects solder balls 12b as "terminals" of the IC package 12 to a printed circuit board (not shown) of a tester.

Figure 4A:
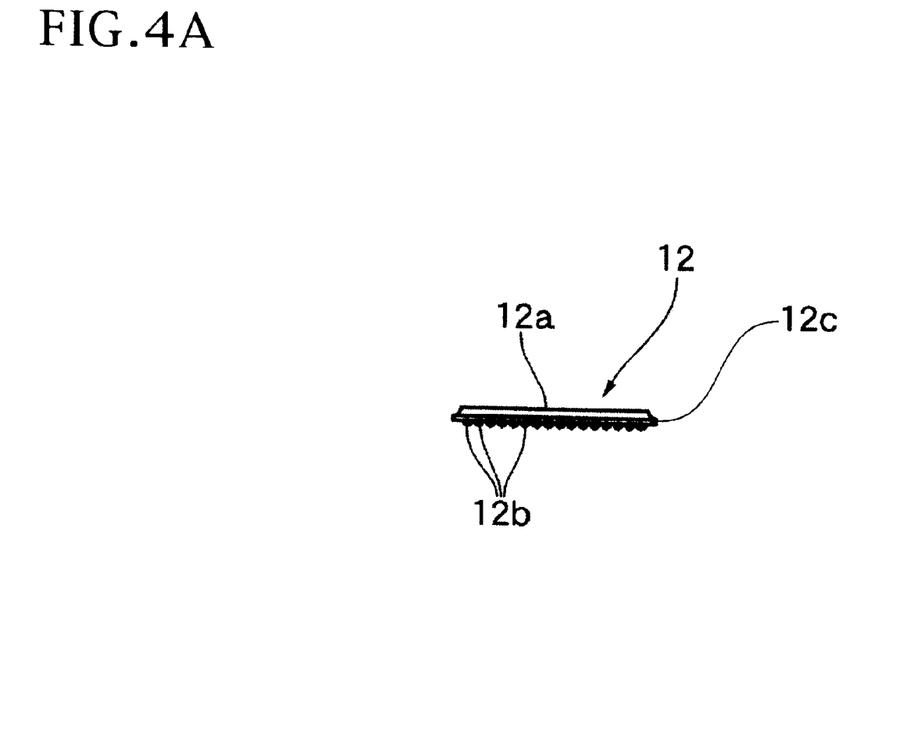
Figure 4B:
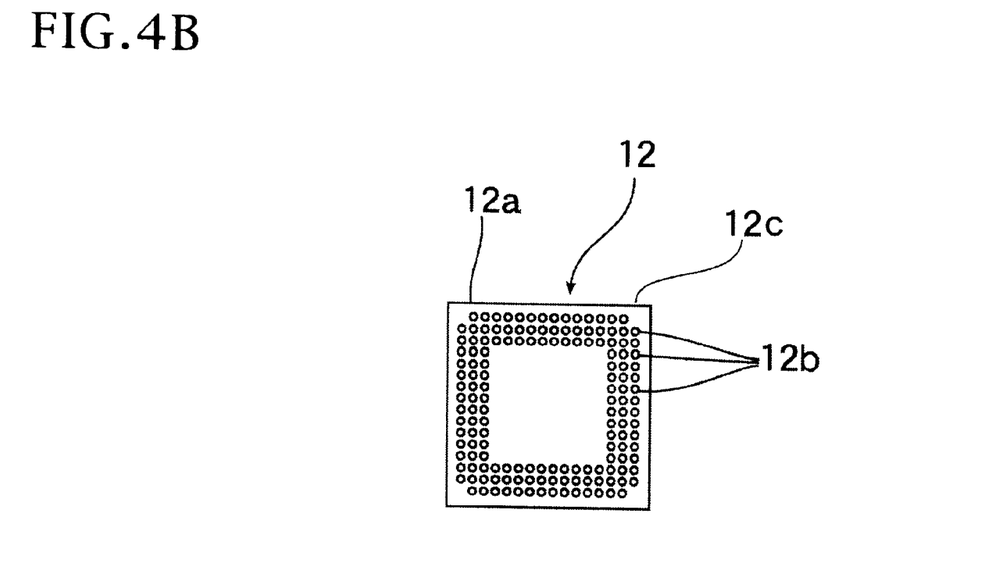

This IC package 12 is, as shown in FIGS. 4A and 4B, for example, called as Ball Grid Array (BGA) type. The BGA type of IC package 12 is provided with a package body 12a having, for example, a substantially square shape. The IC package 12 is also provided with a plurality of solder balls 12b each having a substantially spherical shape and mounted on a bottom (lower) surface of the package body 12a so as to project downward therefrom. The solder balls 12b are arranged to provide a matrix-shape (grid array).

Figure 3:
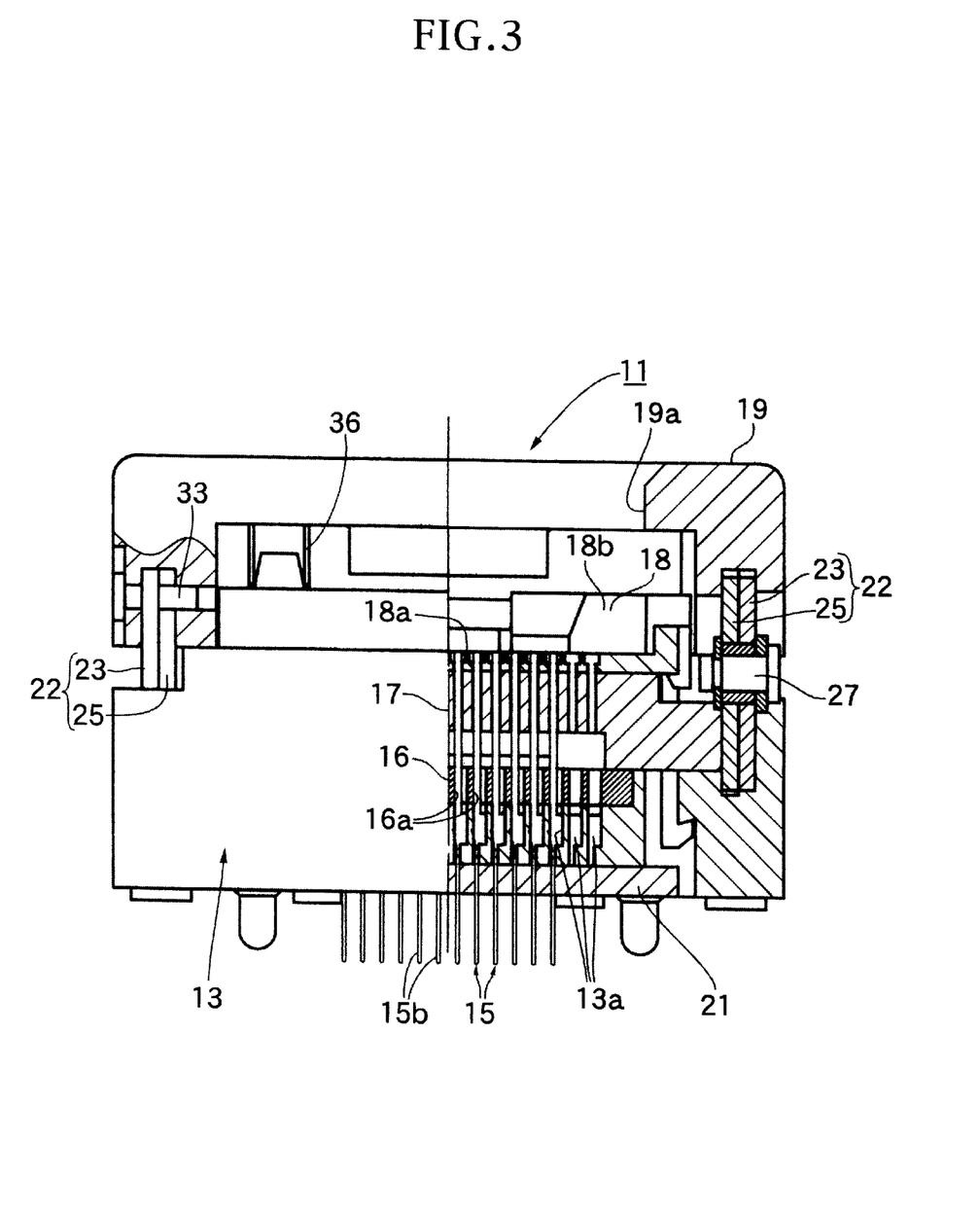
FIG. 3 is a sectional view taken along the line III—III in FIG. 1.

On the other hand, the IC socket 11, as shown in FIG. 3, is provided with a socket body 13 mounted on the printed circuit board and a plurality of contact pins 15 as "electrical conductive members". The contact pins 15 are arranged in a matrix-shape (grid array) similar to the solder balls and permitted to be contacted to or separated from the solder balls 12b, respectively.

The IC socket 11 is also provided with a preload plate 16 through which the contact pins 15 are inserted, a slide plate 17 as "movable plate" and a top plate 18. The preload plate 16, the slide plate 17 and the top plate 18 are mounted on an upper side of the socket body 13 in this order in an upward direction of the socket body 13. Moreover, on the upper side of the top plate 18, an operation member 19 is arranged for sliding the slide plate 17 in a horizontal direction.

The contact pin 15 has an elasticity or springy property and is formed in such a manner that a plate member having a superior conductivity is pressed through a press working so as to provide a shape as shown in FIG. 5A to FIG. 6C.

Figure 5A:
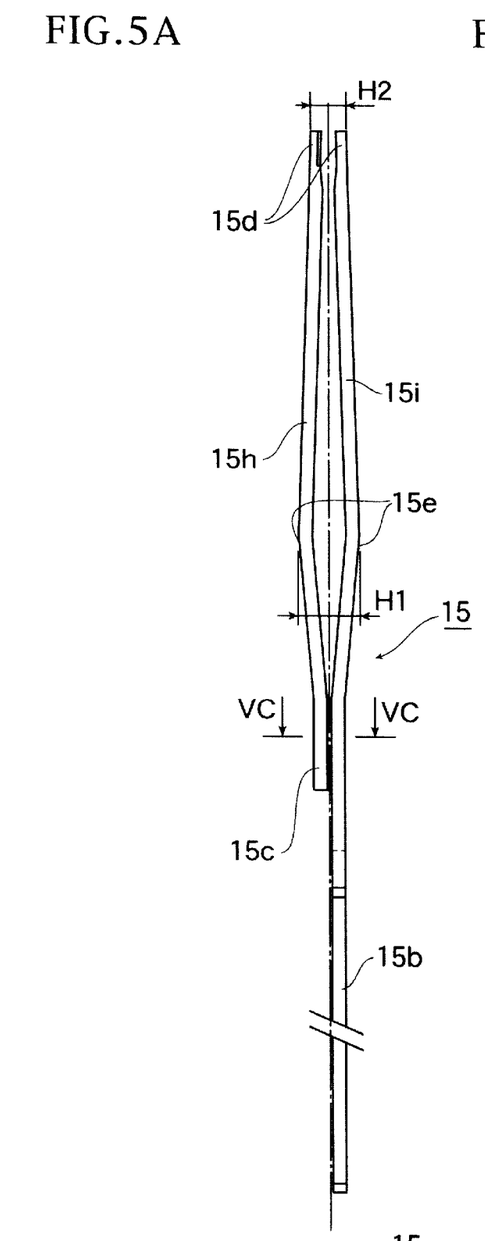
Figure 5B:
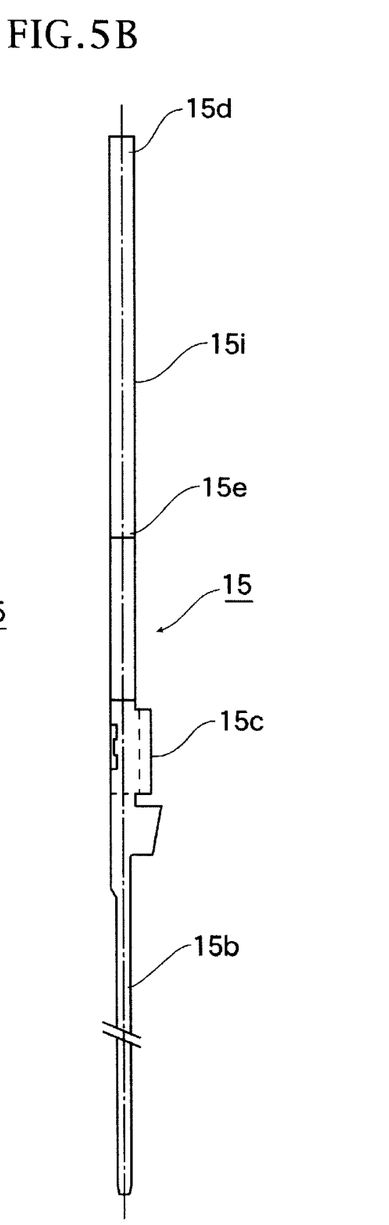
Figure 5C:
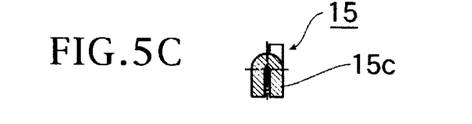

More in detail, the contact pin 15 is formed, at its upper end side, with a stationary side elastic piece 15h and a movable side elastic piece 15i (a pair of elastic pieces) and, at its lower end side, with one integrated solder tail portion 15b. Further, hereinlater, the stationary side elastic piece will be referred simply to the stationary elastic piece and the movable side elastic piece will be also referred simply to the movable elastic piece.

The contact pin 15 is also provided, at its lower side of the elastic pieces 15h and 15i, with a base portion 15c to which the elastic pieces 15h and 15i are integrally formed. The elastic pieces 15h and 15i extend upward from the base portion 15c and the solder tail portion 15b extends downward therefrom. The base portion 15c is bent so as to have a substantially U-shape in its lateral cross section so that the elastic pieces 15h and 15i branch from the base portion 15c so as to oppose to each other. Each of the elastic pieces 15h and 15i is formed at its uppermost end (front end) with a contact portion 15d so that each contact portion 15d is contacted to a side surface portion of the solder ball 12b or separated therefrom so as to clamp the solder ball 12b between the contact portions 15d of the elastic pieces 15h and 15i.

The elastic pieces 15h and 15i of the contact pin 15 are provided with bent portions 15e, respectively, which are formed at respective middle portions thereof so that the respective middle portions of the elastic pieces 15h and 15i are bent apart from each other. Vertex portions of the respective bent portions 15e are pressed by the preload plate 16. In a state that the bent portions 15e are not subjected to any external force, as shown in FIG. 5A, a width (interval) H1 between the respective vertex portions of the bent portions 15e of the paired elastic pieces 15h and 15i is made wider than a width (interval) H2 between respective top ends of the paired contact portions 15d thereof.

The solder tail portion 15b and the base portion 15c of the contact pin 15 are integrally pressed to fit in the press-fit hole 13a so that the solder tail portion 15b projects downward therefrom. The projecting solder tail portion 15b further projects downward through a location board 21 to be inserted into the through hole. Each of the solder tail portions 15b of each of the contact pins 15 is inserted in each of the through holes of the printed circuit board and soldered to establish electrical connection to the printed circuit board.

Figure 6A:
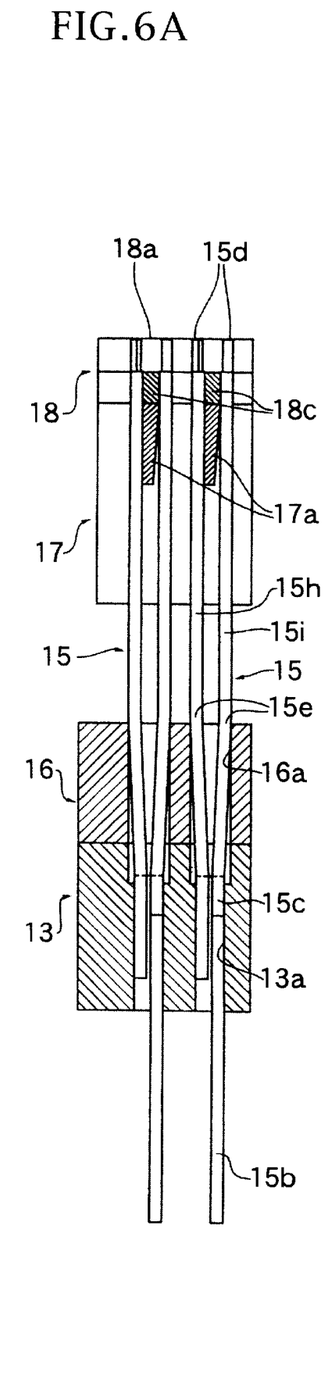
Figures 6B, 6C:
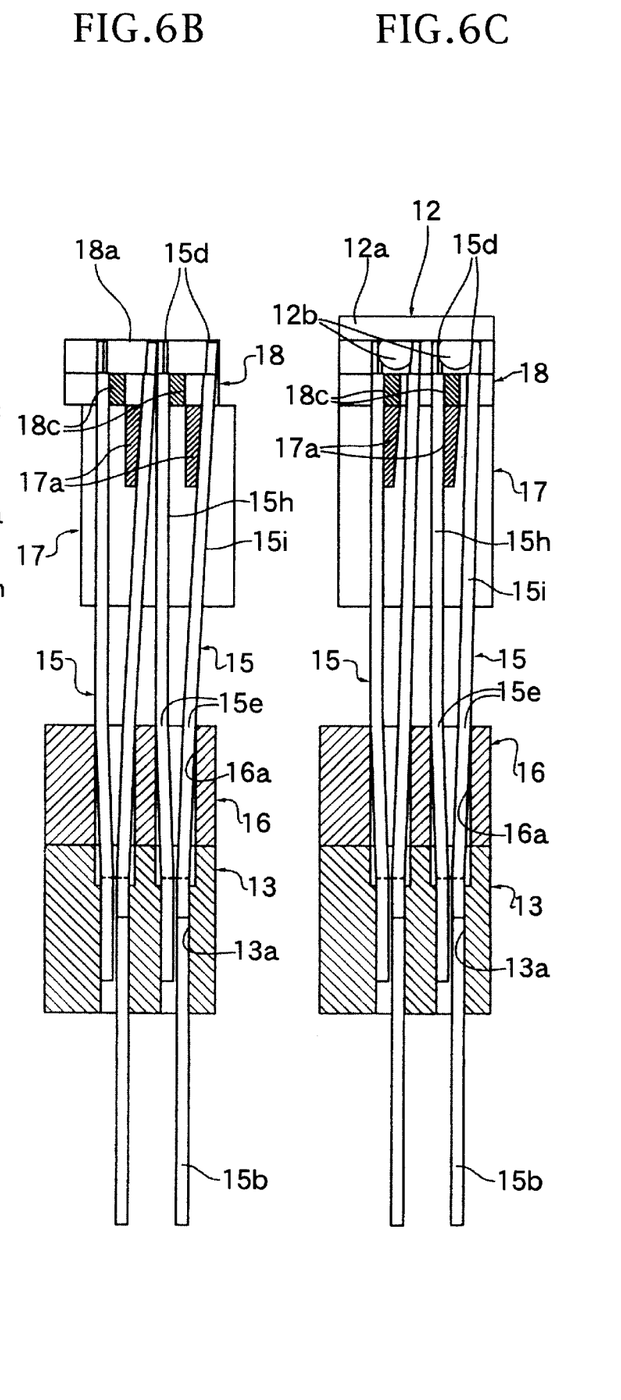

Moreover, the preload plate 16 is, as shown in FIGS. 6A–6C, detachably mounted on the socket body 13, and preload holes 16a are formed to the preload plate 16 so that each of the paired elastic pieces 15h and 15i is inserted in each of the preload holes 16a. A diameter of the preload hole 16a is set so that, in a state that each of the paired elastic pieces 15h and 15i is inserted in each of the preload holes 16a, the preload hole 16a is adapted to previously press the paired elastic pieces 15h and 15i in a direction in which the contact portions 15d of the elastic pieces 15h and 15i are close to each other.

Because the bent portion 15e is formed on each of the paired elastic pieces 15h and 15i, when each of the paired elastic pieces 15h and 15i is inserted in each of the preload holes 16a, the vertex portions of the bent portions 15e are pressed by an inner wall of the preload hole 16a.

On the other hand, the slide plate 17 is arranged to be slidable in a right and left direction (a slide direction in substantially parallel to a mount surface portion 18a of the top plate 18) in FIG. 6A. When the slide plate 17 is slid, the movable elastic piece 15i of the contact pin 15 is elastically deformed so as to displace the contact portion 15d by a predetermined length.

Figure 2:
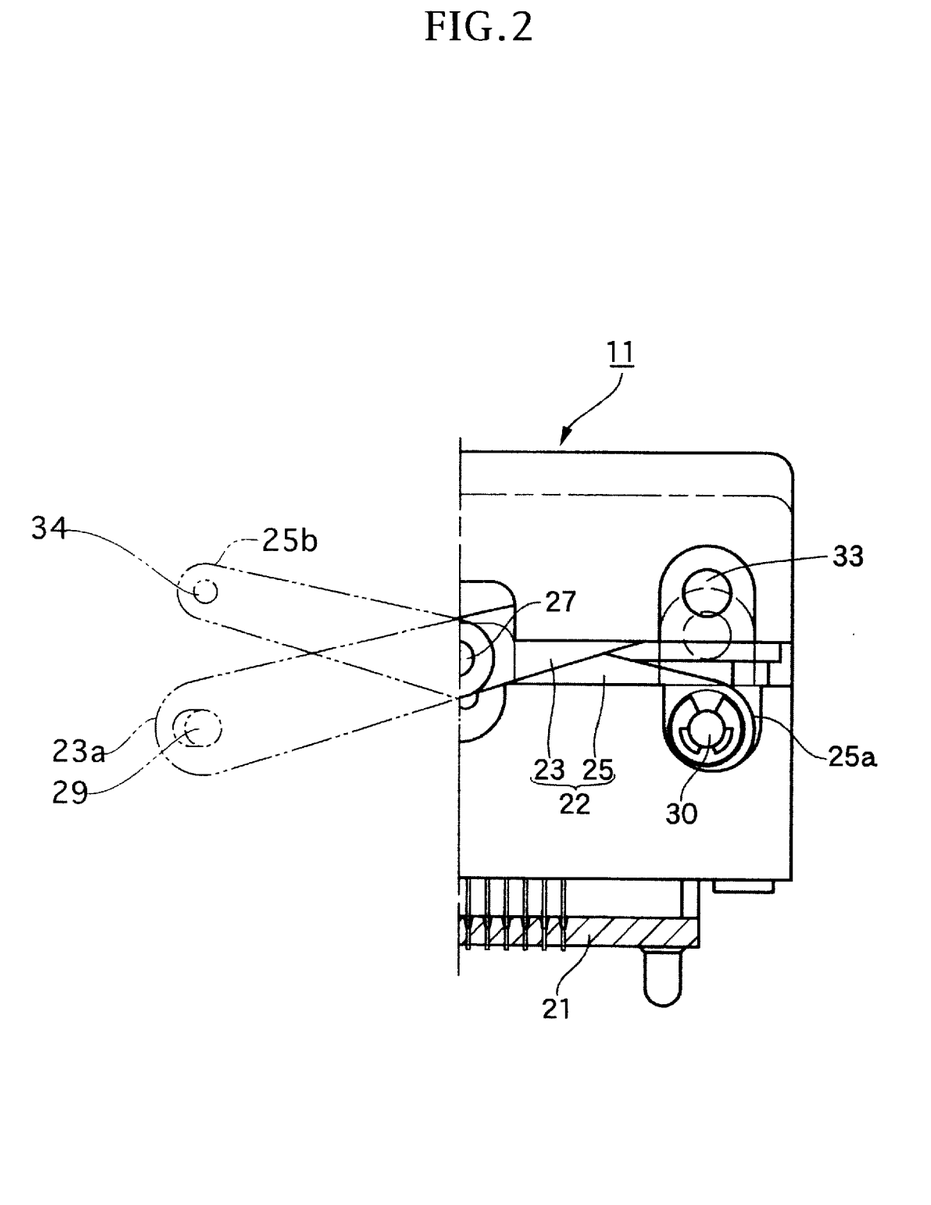
FIG. 2 is a front view showing a right half of the IC socket in FIG. 1.
Figure 7:
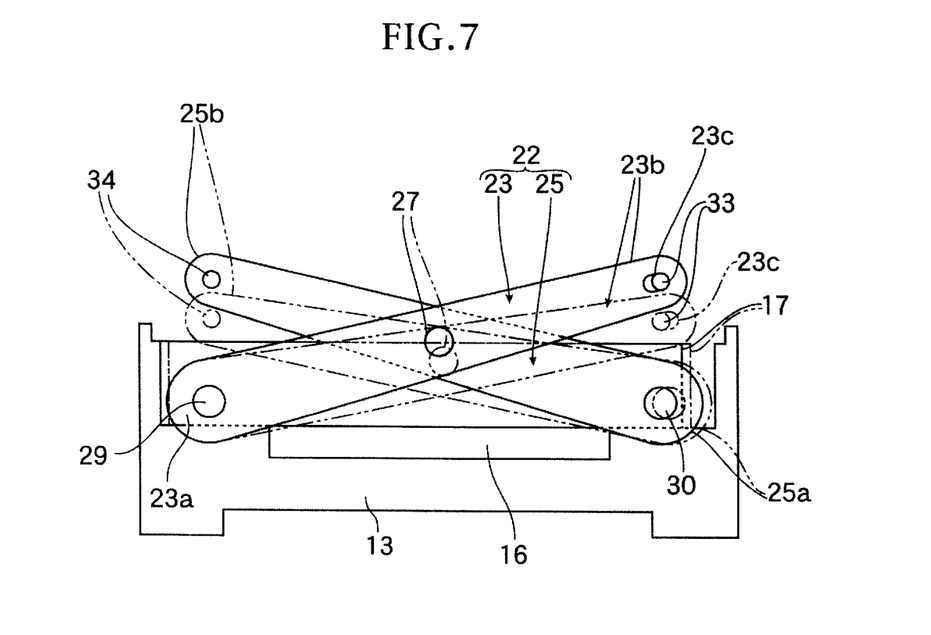
FIG. 7 shows an X-shaped link according to the first embodiment of the present invention for the explanation of the function thereof.

The slide plate 17 is slid through an X-shaped link 22 shown in FIGS. 2 and 7 by vertically moving the operation member 19, and the slide plate 17 is provided with a press portion 17a adapted to press the movable elastic piece 15i so as to elastically deform the movable elastic piece 15i.

The X-shaped links 22 are disposed correspondingly to both side surface portions of the square shaped slide plate 17.

In more concrete, the X-shaped link 22, as shown in FIGS. 2 and 7, comprises a first link member 23 and a second link member 25 each having a same length. The first link member 23 and the second link member 25 are rotatably joined together through a central joint pin 27.

The first link member 23 has a lower end portion 23a which is pivotally joined to the socket body 13 through a lower end joint pin 29. The second link member 25 has a lower end portion 25a of the socket body side, and the slide plate 17 has one end portion in the slide direction thereof. The lower end portion 25a of the second link member 25 is rotatably joined to the one end portion of the slide plate 17 through a lower end joint pin 30. Upper end portions 23b and 25b, that is, other end portions opposite to the one end portions 23a and 25a of the first and second link members 23 and 25 are joined to the operation member 19 through upper joint pins 33 and 34, respectively. The first link member 23 is formed, at its upper end portion 23b, with a slot 23c so that the first link member 23 is joined through the slot 23c to the operation member 17 by the upper joint pin 33.

Figure 1:
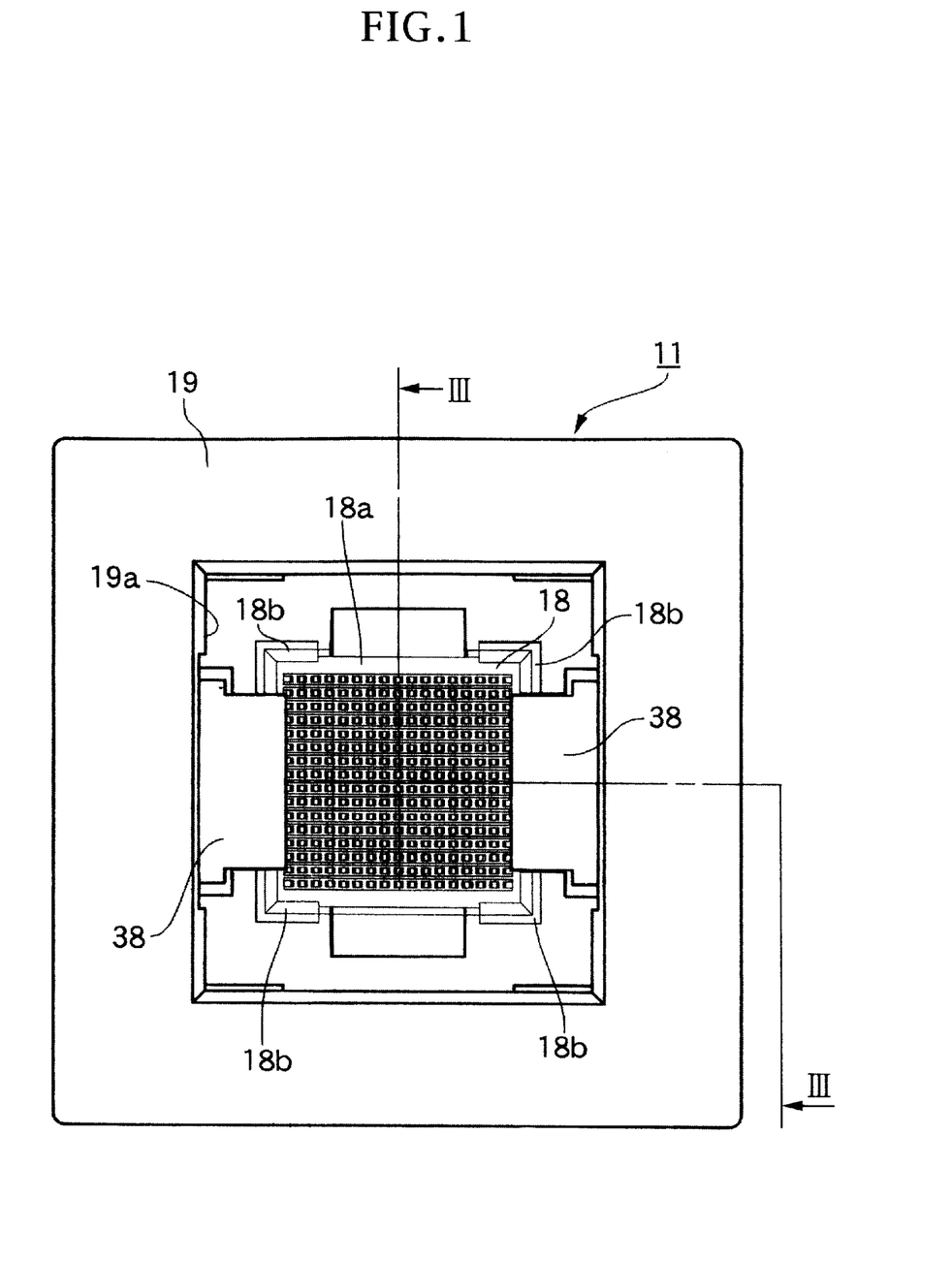
FIG. 1 is a plan view of an IC socket according to a first embodiment of the present invention.
Figure 8:
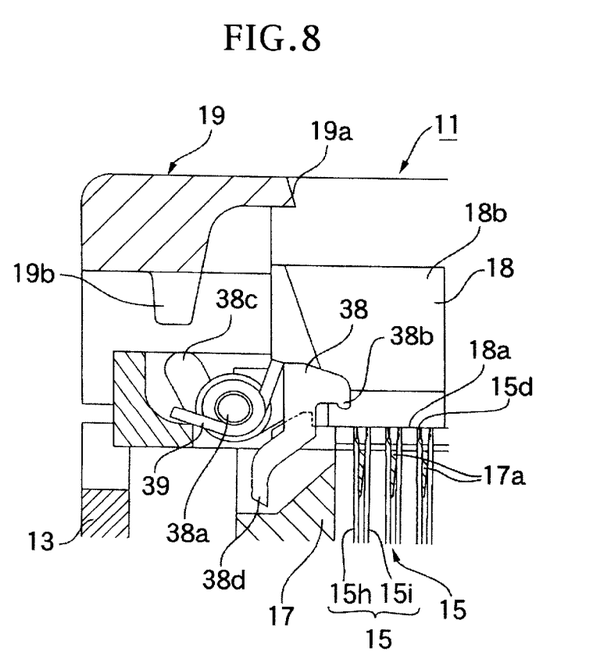
FIG. 8 is a sectional view showing a latch, an operation member and the like according to the first embodiment of the present invention.

The top plate 18 is provided with a mount surface portion 18a on which the IC package 12 is mounted. The top plate 18 is also provided with guide portions 18b for arranging the IC package 12 to a predetermined position on the mount surface portion 18a. As shown in FIG. 1 and FIG. 8, guide portions 18b for positioning the IC package 12 to the predetermined position are mounted to portions corresponding to the corner portions of the IC package 12, respectively.

When the paired elastic pieces 15h and 15i of the contact pin 15 is not subjected to any external force (the contact portions 15d are closed), the positioning portion 18c is clamped with the elastic pieces 15h and 15i.

The operation member 19, as shown in FIGS. 1 and 8, is provided with an opening 19a having a predetermined area which allows the IC package 12 to be inserted therein. The IC package 12 is inserted through the opening 19a so as to be mounted on the mount surface 18a. Further, the operation member 19 is, as shown in FIG. 3, is disposed to be vertically movable with respect to the socket body 13 and is urged upward by means of spring 36. The operation member 19 is formed with an operative protruded (convex) portion 19b for rotating a latch or latch member 38.

A pair of such latches 38 are, as shown in FIG. 1, disposed on opposing side portions of the IC package 12 to be rotatable, as shown in FIG. 8, about shaft portions 38a thereof with respect to the socket body 13. The latches are urged by means of spring 39 in one direction (clockwise direction in FIG. 8) so that pressing portions 38b formed to the front end portion of the latches 38 press the peripheral edge portion 12c of the IC package body 12a towards and against the side of the mount surface 18a.

Each of the latch members 38 is also formed with a press portion 38c to be pressed by the protruded (convex) portion 19b of the operation member 19, and when the operation member 19 is moved downward against the urging force of the spring 36, the press portion 38c of each of the latches 38 is pressed by the protruded portion 19b so that the latch members 38 are rotated in another direction (counterclockwise direction in FIG. 8), so that the pressing portion 38b is retired from the IC package mounting position.

Each of the latches 38 is further formed with a displacement (displacing) portion 38d, which acts to push upward the peripheral edge portion 12c of the IC package body 12a from the lower side thereof at a time when the latch 38 is rotated in the counterclockwise direction in FIG. 8 to thereby separate the IC package body 12a from the mount surface 18a. The displacement portion 38d has, in this embodiment, a sharp end portion.

The operation of the socket for electrical parts of the structures mentioned above will operates in the following manner.

Hereunder, it is to be noted that each of the contact pins 15 carries out substantially the same movement, and accordingly, the movement or operation of only one of the contact pins 15 will be explained.

When each of the IC packages 12 is set to each of the IC sockets 11 arranged on the printed circuit board, the operation member 19 of each IC socket 11 is pressed downward. The downward movement of the operation member 19 slides the slide plate 17 in the right direction, which is shown as a chain double-dashed line in FIG. 7. By the press portion 17a of the slide plate 17 sliding in the right direction, the movable elastic piece 15i is pressed to be elastically deformed. The stationary elastic piece 15h is kept at a predetermined position by the positioning portion 18c of the top plate 18.

According to the above operation, the paired contact portions 15d of the elastic pieces 15h and 15i are opened as shown in FIG. 6B.

Simultaneously with the opening of the contact portions 15d of the contact pin 15, the press portion 38c of each of the latches 38 is pressed by the protruded portion 19b of the operation member 19 so that the latch 38 is rotated in the counterclockwise direction against the urging force of the spring 39 and, hence, the pressing portion 38b is displaced to the retired position.

In this state, the IC package 12 is mounted on the mount surface 18a of the top plate 18 so as to be guided by the guide portions 18b, thereby being set to the predetermined position on the mount surface 18a. Each of the solder balls 12b is then inserted in each of the paired and opened contact portions 15d of each of the contact pins 15 while the solder balls 12b are in a non-contact state with the paired contact portions 15d.

Thereafter, when the downward pressing force applied to the operation member 19 is released, the operation member 19 is moved upward by the urging force of the spring 36, thus sliding the slide plate 17 towards the left direction in FIG. 7 by the X-shaped link 22 and each of the latches 38 is rotated in the clockwise direction in FIG. 8 by the urging force of the spring 39.

When the slide plate 17 is slid in the left direction in FIG. 7, the pressing force applied to the movable elastic piece 15$i$ of the contact pin 15 is released so that the movable elastic piece 15$i$ is getting to return to the original position and the solder ball 12$b$ is clamped by the contact portions 15$d$ of the movable elastic piece 15$i$ and the stationary elastic piece 15$h$ (as referred to FIG. 6C). When the solder ball 12$b$ is clamped by the contact portions 15$d$ of the movable elastic piece 15$i$ and the stationary elastic piece 15$h$, the stationary elastic piece 15$h$ is also slightly elastically deformed so that the contact portion 15$d$ of the stationary elastic piece 15$h$ is slightly displaced to widen the interval between the contact portions 15$d$ of the movable elastic piece 15$i$ and the stationary elastic piece 15$h$.

As a result, each of the solder balls 12$b$ of the IC package 12 and the printed circuit board are electrically connected through each of the contact pins 15 of the IC socket 11, and the peripheral edge portion 12$c$ of the IC package body 12$a$ is pressed by the pressing portion 38$b$ of the latch 38 against the mount surface 18$a$ of the top plate 18.

The IC package 12 is set and held to the IC socket 11 in the manner mentioned above, and the printed circuit board on which such IC socket 11 is mounted is set in a burn-in tank. The burn-in test of the IC package 12 is then carried out by increasing a temperature in the burn-in tank to, for example, about 125° C. When the temperature in the burn-in tank is increased, the solder ball 12$b$ is softened, and at that time, there is a fear that contact portions 15$d$ of the contact pin 15 are stuck (adhere) to the side surface portions of the solder ball 12$b$.

Next, when the IC package 12 is removed from the IC socket 11, similarly to the mounting operation, the operation member 19 is moved downward. Then, the slide plate 17 is slid in the right direction from a state of the slide plate 17 shown in FIG. 6A, for example, and the movable elastic piece 15$i$ is elastically deformed in the right direction, thereby the contact portion 15$d$ of the movable elastic piece 15$i$ being displaced in the right direction. In such case, the slider ball 12$b$ may be stuck to one of the contact portions 15$d$ of the contact pin 15.

Figure 9:
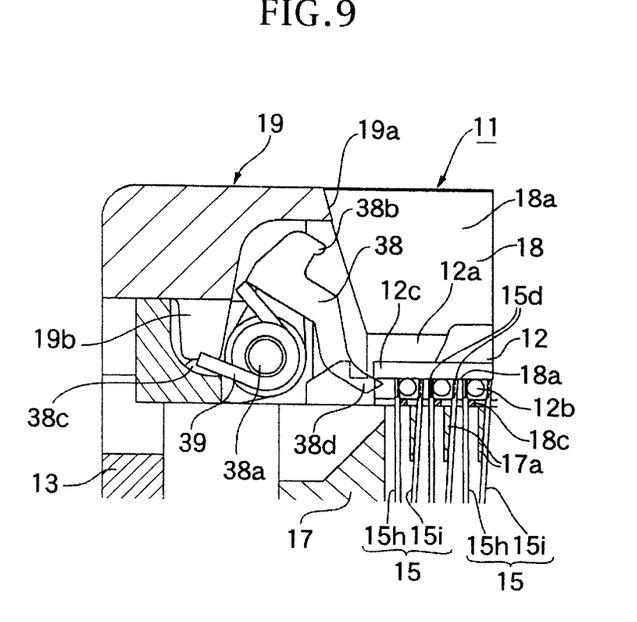
FIG. 9 is a sectional view showing a state that the operation member is depressed from the state shown in FIG. 8.
Figure 10:
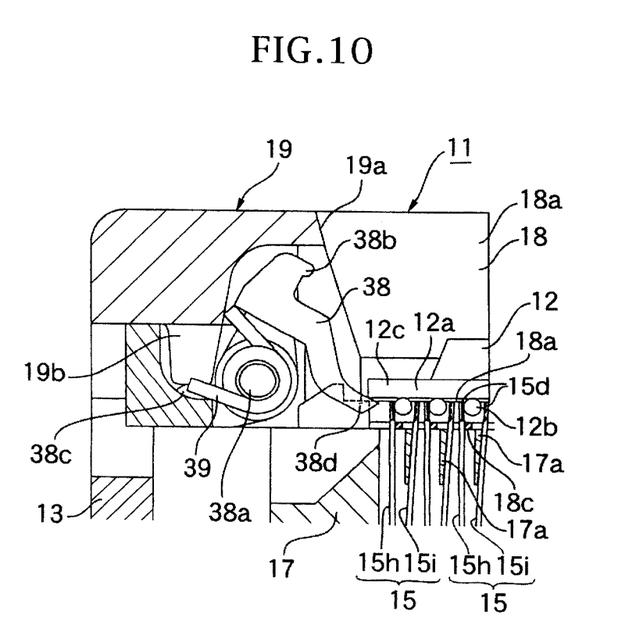
FIG. 10 is a sectional view showing a state that the operation member is further depressed from the state shown in FIG. 9.

However, according to the lowering motion of the operation member 19, the latch 38 is rotated, and as shown in FIG. 9, the displacement portion 38$d$ of the latch 38 abuts against the lower surface of the peripheral edge portion 12$c$ of the IC package body 12$a$ and the operation member 19 is further lowered. In such operation, as shown in FIG. 10, the IC package 12 is moved upward slightly.

Therefore, even if the contact portion 15$d$ of the contact pin 15 is stuck to the solder ball 12$b$ of the IC package 12, by peeling it, the IC package 12 is easily taken out from the IC socket 11 with no specific withdrawal force.

Of course, in the state that the contact portion 15$d$ of the contact pin 15 is not stuck to the solder ball 12$b$, the IC package 12 can be easily taken out from the IC socket 11 by slightly moving upward the IC package 12.

[Second Embodiment]

Figure 11:
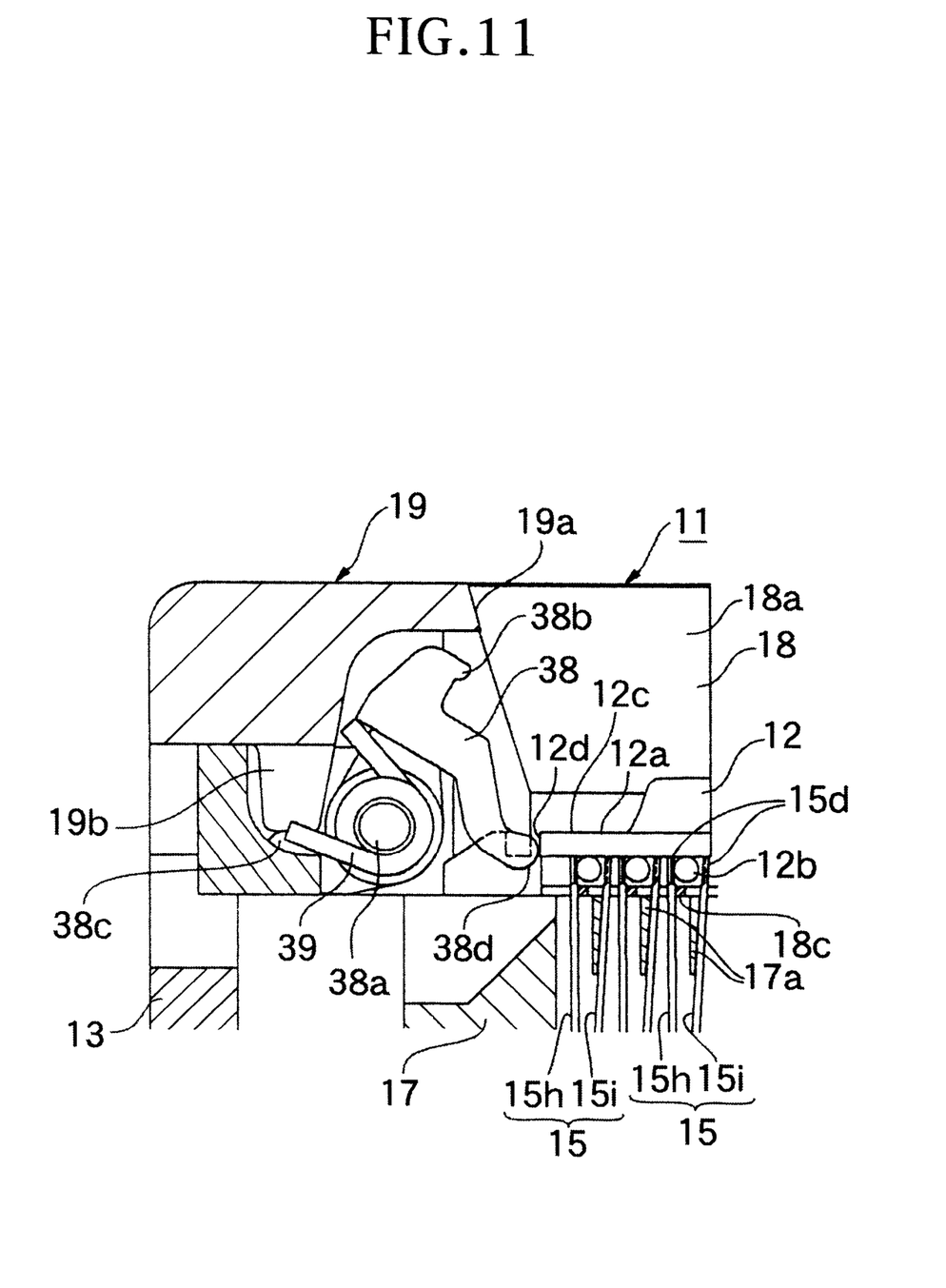
FIG. 11 is a sectional view corresponding to FIG. 9, according to a second embodiment of the present invention.

FIG. 11 represents the second embodiment of the present invention, in which the shape of the displacement (displacing) portion 38$d$ of the latch 38 is differs from that of the first embodiment.

That is, in the displacement portion 38$d$ of the latch 38 of the first embodiment has a sharp front end, whereas the displacement portion 38$d$ of the second embodiment has a round (R) shape. According to this shape, when the latch 38 is rotated, the displacement portion 38$d$ abuts against the end surface 12$d$ of the IC package 12 to thereby slide the IC package 12 on the mount surface 18$a$ of the top plate 18 in a direction parallel thereto.

The IC package 12 is pressed at both end surface portions 12$d$ by a pair of such latches 38, and accordingly, the IC package 12 is moved so that the solder ball 12$b$ inserted into the respective contact portions 15$d$, which are now opened, with a space therefrom. Thus, even in a case where the solder ball 12$b$ is stuck to either one of the contact portions 15$d$, the solder ball 12$b$ is separated therefrom by moving the IC package 12.

Furthermore, as shown in FIG. 11, in a case where the solder ball 12$b$ is liable to be stuck to the contact portion 15$d$ of the stationary elastic piece 15$h$, the solder ball 12$b$ can be separated therefrom by forming the displacement portion 38$d$ only to the left side latch 38 in FIG. 11 and moving the IC package 12 in the right direction.

The other structures of this second embodiment are substantially the same as those of the first embodiment.

In the first and second embodiments, the present invention is applied to the IC socket as "socket for electrical parts", but the present invention is not limited to this application, and the present invention may be applied to a socket for an electrical part except for the IC package. Further, as the terminal, a pin type one or flat type one may be utilized in place of the solder ball 12$b$. In the flat type terminal, the electrically conductive member will be pushed from the lower side. Still furthermore, the contact pin is utilized as the electrically conductive member, the present invention is not limited to it and any other member which is capable to be contacted to the terminal of the electrical part and to be electrically connected thereto.

Still furthermore, in the above embodiments, the movable plate (slide plate 17) is moved horizontally (in the direction substantially parallel to the mount surface), but the movable member may be constituted so as to be vertically movable thereby to displace (open) the contact portions of the paired elastic pieces of the contact pin as the electrically conductive member.

Still furthermore, although the contact pin 15 is formed with the stationary and movable elastic pieces 15$h$ and 15$i$, a modified structure in which only the movable elastic piece 15$i$ is provided may be adopted to the present invention.

It is to be noted that the present invention is not limited to the described embodiments and many other changes and modifications may be made without departing from the scopes of the appended claims.

What is claimed is:

1. A socket for an electrical part, comprising:
    a socket body having a mount portion on which an electrical part is mounted;
    an operation member, with an operative portion, vertically movable with respect to the socket body;
    a conductive portion electrically connected to the electrical part through a contact to a terminal of the electrical part; and
    a latch that presses a peripheral edge portion of the electrical part mounted on the mount portion, and is urged by an urging force in one direction, the latch comprising a pressing portion pressing the peripheral edge portion of the electrical part against the mount portion when said latch is pivoted in a first direction, a displacement portion abutting against the electrical part to move the electrical part when said latch is pivoted in a second direction against the urging force, and a press portion to be pressed by the operative portion of the operation member when the operation member is moved downward so the latch is pivoted in said second direction.

2. A socket for an electrical part according to claim 1, wherein said latch is formed with the displacement portion to move up the electrical part from the mount portion.

3. A socket for an electrical part according to claim 1, wherein said displacement portion of the latch presses an end surface portion of the peripheral portion of the electrical part so as to slide the electrical part on the mount portion.

4. The socket for an electrical part according to claim 1, wherein said latch further comprises a first latch member on a first side of the electrical part and a second latch member on a second side, opposite the first side of the electrical part, wherein the first latch member and the second latch member work together to lift the electrical part when the latch moves in the second direction.

5. A socket for an electrical part according to claim 1, wherein said displacement portion has a sharp end portion abutting against the electrical part.

6. A socket for an electrical part according to claim 1, wherein said displacement portion has a round end portion abutting against the electrical part.

7. A socket for an electrical part, which has a socket body having a mount portion on which an electrical part is mounted, a contact pin having an elastic piece that is contacted to or separated from a solder ball as a terminal of the electrical part, a movable plate attached to the socket body that moves to contact and release the contact pin and a latch for pressing a peripheral edge portion of the electrical part mounted on the mount portion of the socket body, wherein said latch comprises:

a press portion pressing the peripheral edge portion of the electrical part against the mount portion when said latch is pivoted in a first direction; and a displacement portion abutting against the electrical part to move the electrical part when said latch is pivoted in a second direction.

8. A socket for an electrical part according to claim 7, wherein said latch is formed with the displacement portion, respectively, so that the displacement portion moves up the electrical part from the mount portion.

9. A socket for an electrical part according to claim 7, wherein said displacement portion of the latch presses an end surface portion of the peripheral portion of the electrical part so as to slide the electrical part on the mount portion.

10. A socket for an electrical part according to claim 7, wherein said displacement portion has a sharp end portion abutting against the electrical part.

11. A socket for an electrical part according to claim 7, wherein said displacement portion has a round end portion abutting against the electrical part.

12. A socket for an electrical part, comprising:

a socket body having a mount portion on which an electrical part is mounted, said electrical part having terminals;

a plurality of contact pins arranged in the socket body, the plurality of contact pins elastically contacted to or separated from the terminals of the electrical part;

a movable plate attached to the socket body, but movable with respect to the socket body that contacts and releases the plurality of contact pins; and a latch attached to the socket body, said latch having a press portion and a displacement portion, said press portion pressing a peripheral edge portion of the electrical part against the mount portion when said latch is pivoted in a first direction and said displacement portion abutting against the electrical part to move the electrical part when said latch is pivoted in a second direction.

13. A socket for an electrical part according to claim 12, wherein said displacement portion has a sharp end portion abutting against the electrical part.

14. A socket for an electrical part according to claim 12, wherein said displacement portion has a round end portion abutting against the electrical part.

15. A socket for an electrical part according to claim 12, wherein the displacement portion moves the electrical part vertically.

16. A socket for an electrical part according to claim 12, wherein the displacement portion moves the electrical part horizontally.

* * * * *

UNITED STATES PATENT AND TRADEMARK OFFICE
CERTIFICATE OF CORRECTION

PATENT NO. : 6,375,484 B1
DATED : April 23, 2002
INVENTOR(S) : Hideo Shimada

It is certified that error appears in the above-identified patent and that said Letters Patent is hereby corrected as shown below:

<u>Title page,</u>
Item [30], Foreign Application Priority Data, change "May 31, 1999" to
-- May 26, 2000 --.

<u>Column 9,</u>
Lines 26 and 29, change "A" to -- The --.

<u>Column 10,</u>
Lines 9, 12, 40 and 43, change "A" to -- The --.

Signed and Sealed this

Thirteenth Day of August, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,375,484 B1
DATED : April 23, 2002
INVENTOR(S) : Hideo Shimada et al.

It is certified that error appears in the above-identified patent and that said Letters Patent is hereby corrected as shown below:

<u>Title page,</u>
Item [30], Foreign Application Priority Data, change "May 26, 2000" to
-- May 31, 1999 --.

<u>Column 9,</u>
Lines 26 and 29, change "A" to -- The --.

<u>Column 10,</u>
Lines 9, 12, 40 and 43, change "A" to -- The --.

This certificate supersedes Certificate of Correction issued August 13, 2002.

Signed and Sealed this

Eighteenth Day of March, 2003

JAMES E. ROGAN
*Director of the United States Patent and Trademark Office*